US012701854B2

(12) United States Patent
Kang et al.

(10) Patent No.: US 12,701,854 B2
(45) Date of Patent: Aug. 4, 2026

(54) HYBRID SOLAR CELL AND METHOD FOR MANUFACTURING SAME

(71) Applicants:Angelee Kang, Springfield, VA (US);
Luke Kang, Springfield, VA (US);
Youngseok Jun, Seoul (KR)

(72) Inventors: Angelee Kang, Springfield, VA (US);
Luke Kang, Springfield, VA (US);
Youngseok Jun, Seoul (KR)

( * ) Notice: Subject to any disclaimer, the term of this patent is extended or adjusted under 35 U.S.C. 154(b) by 0 days.

(21) Appl. No.: 18/925,010

(22) Filed: Oct. 23, 2024

(65) Prior Publication Data

US 2026/0114109 A1 Apr. 23, 2026

(51) Int. Cl.
| | |
|---|---|
| *H10K 30/81* | (2023.01) |
| *H10K 30/20* | (2023.01) |
| *H10K 30/30* | (2023.01) |
| *H10K 30/50* | (2023.01) |
| *H10K 71/60* | (2023.01) |

(52) U.S. Cl.
CPC ............. *H10K 30/81* (2023.02); *H10K 30/20* (2023.02); *H10K 30/30* (2023.02); *H10K 30/50* (2023.02); *H10K 71/60* (2023.02)

(58) Field of Classification Search
None
See application file for complete search history.

(56) References Cited

FOREIGN PATENT DOCUMENTS

EP 2194055 A1 * 6/2010 ........... C07D 471/04
* cited by examiner

*Primary Examiner* — Eli S Mekhlin

(57) ABSTRACT

The present invention relates to a hybrid solar cell and a fabrication method thereof. The hybrid solar cell according to the present invention comprises: a transparent substrate; a porous layer provided on the transparent substrate, wherein the porous layer comprises a plurality of particles; a first photoactive layer provided on the plurality. of particles; a first charge transport layer provided on the first photoactive layer; a first electrode provided on the porous layer, wherein the first electrode comprises at least one through-hole; a second charge transport layer provided on the first electrode and the first charge transport layer, wherein the second charge transport layer is in direct contact with the first charge transport layer, wherein each of the first charge transport layer and the second charge transport layer is a solid layer and transports electrons or holes; and a second electrode provided on the second charge transport layer.

20 Claims, 2 Drawing Sheets

FIG. 1

Incident Light

HYBRID SOLAR CELL AND METHOD FOR MANUFACTURING SAME

FIELD OF THE INVENTION

The present specification relates to a hybrid solar cell and its fabrication method thereof.

BACKGROUND TO THE INVENTION

Today, nonrenewable energy resources such as petroleum, coal, and natural gas are depleting at a rapid rate. As these resources diminish, the demand for alternative energy sources is increasing. To address this growing need while considering environmental concerns, there is a shift towards renewable energy sources like wind and solar energy. Since sunlight is an inexhaustible resource, solar energy offers a sustainable solution without concerns of depletion, making solar cells a promising emerging energy source.

Currently, crystalline silicon solar cells are widely recognized for their ability to directly convert light into electricity. These cells are used both as independent power sources and as energy systems for vehicles. Typically, crystalline silicon solar cells are made from either silicon single crystals or amorphous silicon. However, producing these materials requires a significant amount of energy, and the solar cells need to generate electricity for nearly a decade to offset the energy consumed during their fabrication.

In contrast, hybrid solar cells have emerged as a cost-effective alternative. Due to their simpler fabrication process and lower material costs, hybrid solar cells are being considered as the next generation of solar technology.

BRIEF DESCRIPTION OF DRAWINGS

FIG. 1 is a view schematically illustrating a hybrid solar cell according to a first exemplary embodiment of the present invention.

FIG. 2 is a view schematically illustrating a hybrid solar cell according to a second exemplary embodiment of the present invention.

EXPLANATION OF SYMBOLS FOR THE MAJOR PARTS OF THE DRAWINGS

101: Transparent substrate, 102: Porous layer, 103: First electrode, 103a: Through-hole, 104: First photoactive layer, 105: First charge transport layer, 106: Second charge transport layer, 107: Second electrode, 208: Second photoactive layer, 209: Third charge transport layer.

DETAILED DESCRIPTION OF THE INVENTION

Technical Problem

The present invention has been made in an effort to provide a hybrid solar cell having excellent power conversion efficiency and a fabrication method thereof.

Technical Solution

The present invention provides a hybrid solar cell comprising:

a transparent substrate;

a porous layer provided on the transparent substrate, wherein the porous layer comprises a plurality of particles;

a first photoactive layer provided on the plurality of particles;

a first charge transport layer provided on the first photoactive layer;

a first electrode provided on the porous layer, wherein the first electrode comprises at least one through-hole;

a second charge transport layer provided on the first electrode and the first charge transport layer, wherein the second charge transport layer is in direct contact with the first charge transport layer, wherein each of the first charge transport layer and the second charge transport layer is a solid layer and transports electrons or holes; and a second electrode provided on the second charge transport layer.

In addition, the present invention provides a method for fabricating a hybrid solar cell, the method comprising:

providing a transparent substrate;

depositing a porous layer on the transparent substrate, wherein the porous layer comprises a plurality of particles;

depositing a first electrode on the porous layer, wherein the first electrode comprises at least one through-hole;

depositing a first photoactive layer on the plurality of particles through the least one through-hole;

depositing a second charge transport layer on the first electrode and the first charge transport layer, wherein the second charge transport layer is in direct contact with the first charge transport layer, wherein each of the first charge transport layer and the second charge transport layer is a solid layer and transports electrons or holes; and depositing a second electrode.

Advantageous Effects

The hybrid solar cell according to the present invention may enhance the collection of photogenerated charges from a porous layer by improving the contact of the porous layer with a first electrode, thereby improving the power conversion efficiency thereof. Further, the method for fabricating a hybrid solar cell according to the present invention may be easily applied to a hybrid solar cell comprising a plurality of semiconductor layers.

BEST MODE

Hereinafter, preferred exemplary embodiments of the present invention will be described in detail with reference to the accompanying drawings.

Figure 1:
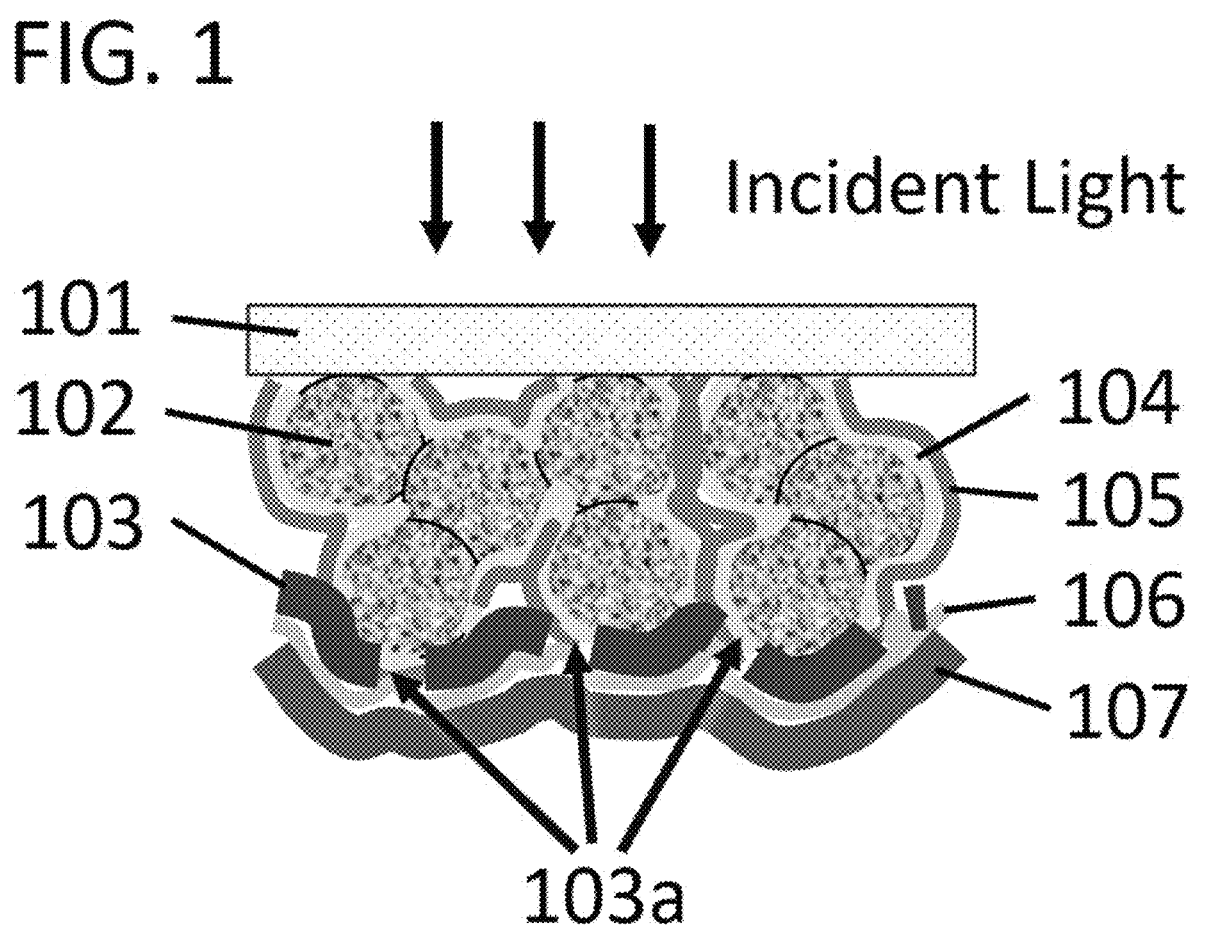

FIG. 1 is a view schematically illustrating a hybrid solar cell according to a first exemplary embodiment of the present invention. The hybrid solar cell according to the first exemplary embodiment comprises a transparent substrate 101; a porous layer 102 provided on the transparent substrate 101, wherein the porous layer comprises a plurality of particles; a first photoactive layer 104 provided on the plurality of particles; a first charge transport layer 105 provided on the first photoactive layer 104; a first electrode 103 provided on the porous layer 102, the first photoactive layer 104, and the first charge transport layer 105, wherein the first electrode 103 comprises at least one through-hole 103a, wherein the first electrode 103 is in direct contact with the porous layer 102; a second charge transport layer 106 provided on the first electrode 103 and the first charge transport layer 105, wherein the second charge transport layer 106 is in direct contact with the first charge transport layer 105, wherein each of the first charge transport layer 105 and the second charge transport layer 106 is a solid layer and transports electrons or holes, wherein the first electrode 103 is provided between the first charge transport layer 105 and the second charge transport layer 106, wherein the first electrode 103 is in direct contact with the first photoactive layer 104, the first charge transport layer 105, and the second charge transport layer 106; and a second electrode 107 provided on the second charge transport layer 106.

Figure 2:
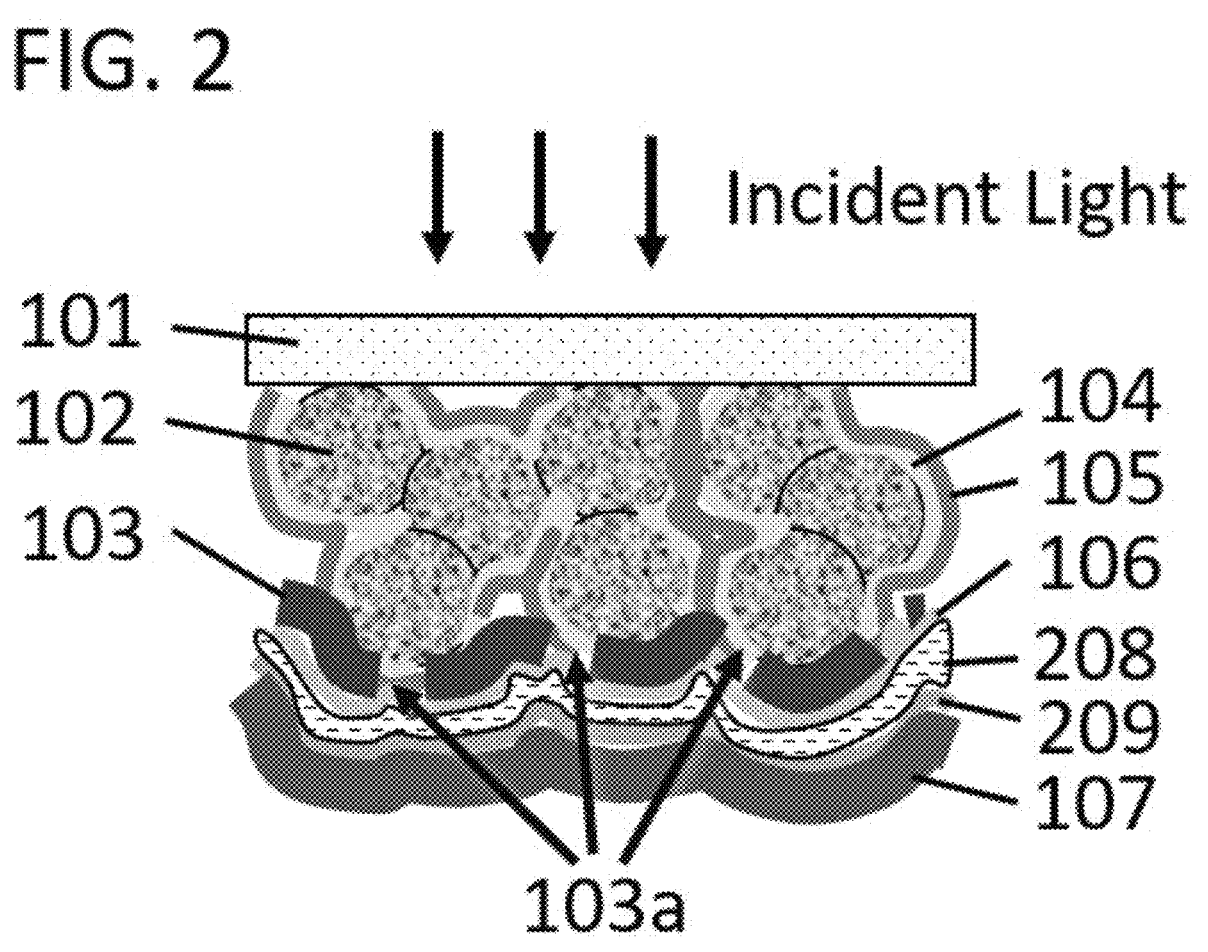

FIG. 2 is a view schematically illustrating a hybrid solar cell according to a second exemplary embodiment of the present invention. Comparing to the first exemplary embodiment, the hybrid solar cell further comprises a second photoactive layer 208 on the second charge transport layer 106 and a third charge transport layer 209 on the second photoactive layer 208, wherein the third charge transport layer 209 is a solid layer and transports electrons or holes.

The transparent substrate 101 may be a glass substrate, a plastic substrate, a ceramic substrate, and the like. Preferably, the transparent substrate 101 has a light transmittance of at least 10% or more. The thickness of the transparent substrate is not particularly limited as long as the transparent substrate has appropriate strength and transparency which are permitted for the solar cell. Examples of the glass comprise soda glass, borosilicate glass, aluminosilicate glass, aluminoborosilicate glass, silica glass, soda lime glass, and the like. Examples of the plastic substrate comprise polyester sheet such as polyethylene terephthalate and polyethylene naphthalate, and sheet such as polyphenylene sulfide, polycarbonate, polysulfone, and polyethylidene nor-bornene. Examples of the ceramic comprise high-purity alumina, and the like. Among the examples of the transparent substrate, the glass substrate is preferred due to stability and operability.

Before forming the porous layer 102 on the transparent substrate 101, it is possible to perform pre-treatments for the transparent substrate 101 that reinforce bonding strength, such as pre-treatment using a precursor solution, plasma treatment, ozone treatment, and chemical treatment. By the result of the pre-treatment, a pre-treatment layer is formed on the transparent substrate 101. For example, it is preferred that the thickness of the pre-treatment layer is 0.1 nm to 50 nm, particularly 0.2 nm to 25 nm.

The porous layer 102 is formed on the transparent substrate 101 or the pre-treatment layer. The porous layer may comprise a material which is generally used in photoelectric conversion. Examples of the material for the pre-treatment and the porous layer 102 comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu2O2$, or combination thereof. These materials may be used either alone or in combination thereof. The porous layer may have a form of particle, rod, tube, wire, needle, film, or combination thereof.

Among the aforementioned examples of the material, titanium oxide is preferred due to stability and safety. Examples of the titanium oxide comprise anatase type titanium oxide, rutile type titanium oxide, amorphous titanium oxide, metatitanic acid, orthotitanic acid, titanium hydroxide, hydrated titanium oxide, and the like.

The fabrication method of the porous layer 102 is not particularly limited. For example, the porous layer 102 may be fabricated by applying a paste comprising a semiconductor material having a form of particle, rod, tube, wire, or needle on the transparent substrate 101, and then sintering the paste. The application process of the paste is also not particularly limited, and it is possible to apply a screen printing process, a doctor blade process, a squeegee process, a spin-coat process, a spray coat process, an inkjet printing process, a gravure coat process, a chemical vapor deposition (CVD) method, a metal-organic chemical vapor deposition (MOCVD) method, a physical vapor deposition (PVD) method, a deposition method, a sputtering method, a sol-gel method, and the like. The porous layer 102 may also be formed by transferring an alignment layer onto the transparent substrate 101 with a semiconductor material having a form of rod, tube, wire, or needle.

It is preferred that an average particle diameter of semiconductor particles used to form the porous layer 102 ranges, for example, from 1 nm to 400 nm, particularly from 5 nm to 100 nm.

The thickness of the porous layer 102 is not particularly limited, and may be controlled to 0.1 µm to 100 µm, particularly 1 µm to 75 µm. In addition, it is preferred that the porous layer 102 is subjected to heat treatment in order to remove a solvent and organic materials and increase the strength of the porous layer 102 and adhesion between the porous layer 102 and the transparent substrate 101. The temperature and time of the heat treatment are not particularly limited. It is preferred that the heat treatment temperature is controlled to 30° C. to 700° C., particularly 70° C. to 600° C., and that the heat treatment time is controlled to 5 minutes to 10 hours, particularly 10 minutes to 6 hours.

The first electrode 103 is coated on the porous layer 102 in order to collect charges from the porous layer 102 and release charges to the outside of the solar cell. The material for the first electrode 103 is not particularly limited, and a metal, a conductive oxide, a carbon material, a conductive polymer, and the like may be applied. Examples of the metal comprise titanium, nickel, platinum, gold, silver, copper, aluminum, tungsten, rhodium, indium, calcium, magnesium, and the like. These materials may be used either alone or in combination thereof. Examples of the conductive oxide comprise tin oxide, fluorine-doped tin oxide (FTO), indium oxide, tin-doped indium oxide (ITO), zinc oxide, aluminum-doped zinc oxide (AZO), and the like. These materials may be used either alone or in combination thereof. Examples of the carbon material comprise carbon nanotubes, graphene, carbon black, and the like. These materials may be used either alone or in combination thereof. Examples of the conductive polymer comprise poly(3,4-ethylenedioxythiophene):polystyrene sulfonate (PEDOT-PSS), polypyrrole, polyaniline, poly-3,4-ethylenedioxythiophene (poly-EDT), and the like. These materials may be used either alone or in combination thereof. The material is more preferably a conductive metal.

The first electrode 103 is coated on the porous layer 102 by a deposition method. A part or whole of the first electrode 103 may be embedded in the porous layer 102. The first electrode 103 may be formed by depositing a conductive material such as a metal, a conductive oxide, a carbon material, and a conductive polymer on the porous layer 102 by physical vapor deposition such as thermal metal evaporation, electron beam evaporation, RF sputtering, magnetron sputtering, atomic layer deposition, arc vapor deposition, and ion beam assisted deposition, or a chemical vapor deposition process such as CVD, MOCVD, and plasma-enhanced chemical vapor deposition (PECVD). The deposition process is controlled such that a porous structure having at least one through-hole is formed on the porous layer. In order to obtain good conductivity throughout the entire surface of the current collecting electrode, the first electrode may have a porous structure comprising a sheet form and through-holes. It is preferred that the porous structure of the first electrode 103 is simply formed by a deposition method instead of other materials such as a pore forming auxiliary agent.

When a conductive material is deposited in order to form the first electrode 103, a topographical form may depend on a surface topographical form of the porous layer 102. For example, a rough surface having many through-holes may be formed on a rough surface such as the porous layer 102. When the first electrode 103 is coated on the surface of the rough porous layer 102, the surface of the current collecting electrode may also have a rough surface substantially similar to the topographical form of the surface of the porous layer 102. Therefore, the contact area between the first electrode and the porous layer may be maximized, and the power conversion efficiency of the solar cell may be increased. Furthermore, by forming the surface of the first electrode to be substantially the same as the topographical form of the surface of the porous layer, the first electrode may comprise at least one through-hole without a separately additional treatment such as patterning or a pore forming auxiliary agent.

In order to obtain the first electrode 103 having substantially the same topographical form as that of the surface of the porous layer 102, it is preferred that the thickness of the first electrode is controlled to a range from 5 nm to 1,000 nm using the above-described fabrication method.

According to the present invention, in order to form the first electrode 103 having at least one through-hole, physical vapor deposition of a metal or a conductive oxide is preferably applied. For the deposition of the metal, aluminum, titanium, nickel, platinum and/or tungsten are preferably applied. For the deposition of the conductive oxide, fluorine-doped tin oxide (FTO) and tin-doped indium oxide (ITO) are preferably applied.

In the case of physical vapor deposition of a metal or a conductive oxide, the number of through-holes of the first electrode 103 may be controlled by changing a deposition rate, and the deposition rate may be controlled to 0.01 nm/sec to 50 nm/sec. The deposition rate of the first electrode 103 is preferably 0.05 nm/sec to 25 nm/sec. When the deposition rate of the first electrode 103 is 0.01 nm/sec to 50 nm/sec, it is possible to fabricate the first electrode 103 having at least one through-hole.

In the case of physical vapor deposition of a metal or a conductive oxide, the number of through-holes of the first electrode 103 is not particularly limited as long as the number of through-holes allows a photosensitizing dye solution and an electrolyte material to be permeated. The number of through-holes of the first electrode 103 may be 0.01 hole/mm$^2$ to 10$^9$ hole/mm$^2$, preferably 0.1 hole/mm$^2$ to 10$^8$ hole/mm$^2$, and more preferably 1 hole/mm$^2$ to 10$^7$ hole/mm$^2$.

In the case of physical vapor deposition of a metal or a conductive oxide, the diameter of through-holes in the first electrode 103 is not particularly limited. The diameter of through-holes in the first electrode 103 may be 1 nm to 10$^5$ nm, preferably 3 nm to 10$^4$ nm, and more preferably 5 nm to 10$^3$ nm.

In the case of physical vapor deposition of a metal or a conductive oxide, the thickness of the first electrode 103 is an important element. A thick film does not form a through-hole and a thin film does not have sufficient conductivity for collecting electrons from the porous layer 102. The film thickness of the first electrode 103 may be 5 nm to 1,000 nm, preferably 8 nm to 500 nm, and more preferably 12 nm to 300 nm. When the film thickness of the first electrode 103 is less than 5 nm, conductivity of the first electrode may be too low to be used as a current collecting electrode. On the contrary, when the film thickness of the first electrode 103 exceeds 1,000 nm, through-holes are too small or not formed.

The first electrode 103 may or may not be transparent. When a second photoactive layer 208 is provided on the second charge transport layer 106 and a third charge transport layer 209 is provided on the second photoactive layer 208, it is preferred that the first electrode 103 is transparent such that incident light reaches the second photoactive layer 208 through the first electrode (FIG. 2). When the first electrode is transparent, the first electrode 103 may be formed in the form of a thin film made of a metal, a conductive oxide, or a carbon material.

When the first electrode 103 is transparent, the second photoactive layer 208 and the third charge transport layer 209 may be formed on the second charge transport layer 106, as illustrated in FIG. 2. In the structure, more electrons/holes may be generated from the first photoactive layer 104 and the second photoactive layer 208, thereby obtaining high power conversion efficiency.

Before the first photoactive layer 104 is deposited on the porous layer 102, for activation of the surface of the porous layer 102 and/or an increase in the surface area thereof, it is possible to perform a post-treatment using a precursor solution, a heat treatment, a plasma treatment, an ozone treatment, and a chemical treatment for the porous layer 102. Examples of a material for the post-treatment comprise titanium oxide, zinc oxide, tin oxide, niobium oxide, zirconium oxide, cerium oxide, tungsten oxide, silicon oxide, aluminum oxide, nickel oxide, tantalum oxide, barium titanate, strontium titanate, calcium titanate, zinc sulfide, lead sulfide, bismuth sulfide, cadmium sulfide, $CuAlO_2$, $SrCu2O2$, and the like. As a result of the post-treatment, a post-treatment layer (semiconductor thin film) is formed on the porous layer 102. For example, it is preferred that the thickness of the post-treatment layer is 0.1 nm to 50 nm, particularly 0.2 nm to 25 nm.

The first photoactive layer 104 may be deposited on the porous layer 102 by immersing the porous layer 102 coated with the first electrode 103 in a solution comprising a material for first photoactive layer 104, or by dropping the solution comprising the material for first photoactive layer 104 on the porous layer 102 with the first electrode 103. The solution comprising the material for first photoactive layer 104 may be permeated into the porous layer 102 via the through-hole 103a of the first electrode 103. The solution is not particularly limited as long as the material for first photoactive layer 104 may be dissolved therein. Examples of the solution comprise organic solvents such as alcohol, acetone, toluene, acetonitrile, chloroform, alkylamines, dimethylformamide, γ-butyrolactone, dimethyl sulfoxide and the like. These solvents may be used either alone or in combination thereof.

The material for the first photoactive layer 104 is not particularly limited, and perovskite materials, dye sensitizers, and the like may be applied. Examples of the perovskite materials comprise $CH_3NH_3PbI_3$, $CH_3NH_3PbCl_3$, $CH_3NH_3PbI_{3-x}Cl$, $CH_3NH_3PbI_{3-x}Br_x$, $HC(NH_2)_2PbI_3$, $HC(NH_2)_2PbCl_3$, $HC(NH_2)_2PbBr_3$, $HC(NH_2)_2PbI_{3-x}Cl$, $HC(NH_2)_2PbI_{3-x}Br_x$, $[HC(NH_2)_2]_{1-x}Cs_xPbI_3$, $[HC(NH_2)_2]_{1-x}Cs_xPbBr_3$, $[HC(NH_2)_2]_{1-x}Cs_xPbI_{3-y}Br_y$, $CsPbI_{3-x}Br_x$, $CH_3NH_3Pb_{1-x}Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-d}Br_d$, and $(CH_3NH_3)_{1-x-y-z}[HC(NH_2)_2]_zCs_yRb_xPbI_{3-d}Br_d$. In one aspect the Pb of the perovskite is partially or completely replaced by other group IV elements. These materials may be used either alone or in combination thereof. The dye sensitizers may be dye sensitizers having an absorbance in a wide range of a visible light region and/or an IR region, and may be, for example, organic dyes, metal complex dyes, and the like. Examples of the organic dyes comprise azo type dyes, quinone type dyes, quinone-imine type dyes, quinacridone type dyes, squarylium type dyes, cyanine type dyes, merocyanine type dyes, triphenylmethane type dyes, xanthene type dyes, porphyrin type dyes, perylene type dyes, indigo type dyes, and naphthalocyanine type dyes. Examples of the metal complex dyes comprise phthalocyanine type dyes and ruthenium type dyes, comprising, as a dominant metal, a metal such as Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ir, Pd, Os, Ga, Tb, Eu, Rb, Bi, Se, As, Sc, Ag, Cd, Hf, Re, Au, Ac, Tc, Te, and Rh. The perovskite materials and the dye sensitizers may be used either alone or in combination thereof.

The second photoactive layer 208 employs a donor/acceptor bilayer structure including an electron donor layer and an electron acceptor layer, or a bulk-heterojunction ((donor+acceptor) blend)) structure. Or, the second photoactive layer 208 uses a combination structure (donor/(donor+acceptor)/acceptor) where the bulk-heterojunction structure is inserted between the electron donor layer and the electron acceptor layer. Examples of a material for the donor comprise polythiofan, polypyrrole, polyvinylcarbazole, polyaniline, polyacetylene, poly-3-hexylthiophene (P3HT), polyphenylenevinylene (PPV), 2-methoxy-5-(2'-ethylhexyloxy) phenylene vinylene polymer (MEHPPV), 1,4-bis[(4-styryl)styryl]-2-methoxy-5-(2'-ethylhexoxy)benzene polymer, poly(2-methoxy,5-(3',7'-dimethyloctyloxy)-1,4-phenylenevinylene (MDMOPPV), poly(2,5-(2-ethylhexyloxy)-1,4-phenylenevinylene) (BEHPPV), and the like. These materials may be used either alone or in combination thereof. Examples of a material for the acceptor comprise fullerene, a fullerene derivative, a polymer, and a small molecule material. These materials may be used either alone or in combination thereof.

A material for the first charge transport layer 105 and a material for the second charge transport layer 106 may or may not be the same material. The material for the first charge transport layer 105 and the material for the second charge transport layer 106 are not particularly limited, and a hole transport material or an electron transport material may be applied. Examples of the hole transport material comprises, but not limited to, spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis (2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyDimide), Li-TFSI (lithium bis (tritluoromethanesulforiyi)imide), tBP (tert-butylpyridinc), PEDOT:PSS (poly(3,4-ethylenedioxythiophene):poly(styrene sulfonate)), PTAA (Poly[bis(4-phenyl)(2,4,6-trimethylphenyl)amine]), Poly-TPD (Poly[N,N'-bis(4-butylphenyl)-N,N-bis(phenyl)-benzidine]), TFB (poly(9,9'-dioctylfluorene-co-N-(4-butylphenyl) diphenylamine), MEH-PPV (poly[2-methoxy-5-(2'-ethylhexyloxy)-1,4-phenylene vinylene]), NiOx, MoOx, Wox, CuOx, Cu[SCN]x, V2O5, MoS2, CuGaO2, PbS, CuI, CuBr, CuSCN, Cu2O, CuO, ClS, MXenes, and the like. Examples of the electron transport material comprises, but not limited to, fullerene, perylene, P(NDI2OD-T2) (poly([N,N'-bis(2-octyldodecyl)-naphthalene-1,4,5,8-bis (dicarboximide)-2,6-diyl]-alt-5,5'-(2,2'-bithiophene))), ZnOS, $TiO_x$, $SnO_x$, $ZnO_x$, CdS, $Sb_2S_3$, $Bi_2S_3$, MXenes, and the like.

A material for the third charge transport layer 209 is not particularly limited, and a hole transport material or an electron transport material may be applied. Examples of the hole transport material comprises, but not limited to, spiro-OMeTAD (2,2',7,7'-tetrakis-(N, N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta [2,1-b:3,4-b']dithiophene-2,6-diyl]]), PVK (poly(N-vinylcarbazole)), HTM-TFSI (1-hexyl-3-methylimidazolium bis(trifluoromethylsulfony-Dimide), Li-TFSI (lithium bis(tritluoromethanesulforiyi)imide), tBP (tert-butylpyridinc), PEDOT:PSS (poly(3,4-ethylenedioxythiophene):poly(styrene sulfonate)), PTAA (Poly[bis(4-phenyl)(2,4,6-trimethylphenyl)amine]), Poly-TPD (Poly[N, N'-bis(4-butylphenyl)-N,N-bis(phenyl)-benzidine]), TFB (poly(9,9'-dioctylfluorene-co-N-(4-butylphenyl) diphenylamine), MEH-PPV (poly[2-methoxy-5-(2'-ethylhexyloxy)-1,4-phenylene vinylene]), NiOx, MoOx, Wox, CuOx, Cu[SCN]x, V2O5, MoS2, CuGaO2, PbS, CuI, CuBr, CuSCN, Cu2O, CuO, ClS, MXenes, and the like. Examples of the electron transport material comprises, but not limited to, fullerene, perylene, P(NDI2OD-T2) (poly([N, N'-bis(2-octyldodecyl)-naphthalene-1,4,5,8-bis(dicarboximide)-2,6-diyl]-alt-5,5'-(2,2'-bithiophene))), ZnOS, $TiO_x$, $SnO_x$, $ZnO_x$, CdS, $Sb_2S_3$, $Bi_2S_3$, MXenes, and the like.

The second electrode 107 is coated on the second charge transport layer 106 in order to collect charges from the second charge transport layer 106 and release charges to the outside of the solar cell (FIG. 1). The second electrode 107 is coated on the third charge transport layer 209 in order to collect charges from the third charge transport layer 209 and release charges to the outside of the solar cell (FIG. 2). The material for the second electrode 107 is not particularly limited, and a metal, a conductive oxide, a carbon material, a conductive polymer, and the like may be applied. Examples of the metal comprise titanium, nickel, platinum, gold, silver, copper, aluminum, tungsten, rhodium, indium, calcium, magnesium, and the like. These materials may be used either alone or in combination thereof. Examples of the conductive oxide comprise tin oxide, fluorine-doped tin oxide (FTO), indium oxide, tin-doped indium oxide (ITO), zinc oxide, aluminum-doped zinc oxide (AZO), and the like. These materials may be used either alone or in combination thereof. The second electrode 107 may employ multiple layers of these materials. Examples of the carbon material comprise carbon nanotubes, graphene, carbon black, and the like. These materials may be used either alone or in combination thereof. Examples of the conductive polymer comprise poly(3,4-ethylenedioxythiophene):polystyrene sulfonate (PEDOT-PSS), polypyrrole, polyaniline, poly-3,4-ethylenedioxythiophene (poly-EDT), and the like. These materials may be used either alone or in combination thereof. The material is more preferably a conductive metal. The second electrode 107 may employ multiple layers of the materials described above.

The second electrode 107 may be formed by depositing a conductive material such as a metal, a conductive oxide, a carbon material, and a conductive polymer by physical vapor deposition such as thermal metal evaporation, electron beam evaporation, RF sputtering, magnetron sputtering, atomic layer deposition, arc vapor deposition, and ion beam assisted deposition, or a chemical vapor deposition process such as CVD, MOCVD, and plasma-enhanced chemical vapor deposition (PECVD).

Hereinafter, the present invention will be described in more detail through the Examples, but the scope of the present invention is not limited by the following Examples.

EXAMPLES

Example 1

A hybrid solar cell was fabricated by the following method.

Step 1: Preparing Transparent Substrate 101

A microscope slide glass having a size of 0.5 inch×1 inch was used. The microscope slide glass was cleaned and heat-treated.

Step 2: Deposition of Porous Layer 102

A paste comprising $TiO_2$ nanoparticles was doctor-bladed on the microscope slide glass to form a porous $TiO_2$ semiconductor layer 102. A uniform film having a thickness of 9.5 μm was formed by the one-time doctor-blading of the paste which had been sintered.

Step 3: Deposition of First Electrode 103

An aluminum layer as the first electrode 103 was deposited on the porous TiO2 semiconductor layer 102 by performing thermal deposition. The thickness of the layer was 50 nm.

Step 4: Deposition of First Active Layer 104 on Porous Layer 102

A perovskite precursor solution was prepared by dissolving $PbBr_2$ and FABr (Sigma-Aldrich) in a mixture of N, N-dimethylformamide (DMF) and dimethyl sulfoxide (DMSO) (4:1 (v/V) DMF:DMSO). The porous $TiO_2$ semiconductor layer 102 comprising the first electrode 103 was immersed into the perovskite precursor solution under vacuum/break and was subsequently annealed.

Step 5: Deposition of First Charge Transport Layer 105 on First Active Layer 104

A spiro-OMeTAD solution dissolved in chlorobenzene was dispensed onto the device after Step 4 under vacuum/break and was subsequently dried.

Step 6: Deposition of Second Charge Transport Layer 106 on First Electrode 103 and First Charge Transport Layer 105

The spiro-OMeTAD solution was spin-coated on the first electrode 103.

Step 7: Deposition of Second Electrode 107

A silver layer was deposited on the second charge transport layer 106 by performing thermal deposition. The thickness of the layer was 100 nm.

Example 2

A hybrid solar cell was fabricated by the following method.

Step 1: Preparing Transparent Substrate 101

A microscope slide glass having a size of 0.5 inch×1 inch was used. First, the microscope slide glass was cleaned and heat-treated.

Step 2: Deposition of Porous Layer 102

A paste comprising $TiO_2$ nanoparticles was doctor-bladed on the microscope slide glass to form a porous $TiO_2$ semiconductor layer 102. A uniform film having a thickness of 9.5 μm was formed by the one-time doctor-blading of the paste which had been sintered.

Step 3: Deposition of First Electrode 103

An aluminum-doped zinc oxide (AZO) layer as the first electrode 103 was deposited on the porous $TiO_2$ semiconductor layer 102 by magnetron sputter. A 99.99% purity AZO target was used. The thickness of the film measured with an SEM was 100 nm.

Step 4: Deposition of First Active Layer 104 on Porous Layer 102

A perovskite precursor solution was prepared by dissolving PbBr2 and FABr (Sigma-Aldrich) in a mixture of N,N-dimethylformamide (DMF) and dimethyl sulfoxide (DMSO) (4:1 (v/v) DMF:DMSO). The porous $TiO_2$ semiconductor layer 102 comprising the first electrode 103 was immersed into the perovskite precursor solution under vacuum/break and was subsequently annealed.

Step 5: Deposition of First Charge Transport Layer 105 on First Active Layer 104

A spiro-OMeTAD solution dissolved in chlorobenzene was dispensed onto the device after Step 4 under vacuum/break and was subsequently dried.

Step 6: Deposition of Second Charge Transport Layer 106 on First Electrode 103 and First Charge Transport Layer 105

The spiro-OMeTAD solution was spin-coated on the first electrode 103.

Step 7: Deposition of Second Active Layer 208 on Second Charge Transport Layer 106

A P3HT:PCBM (1:1 (w/w)) solution dissolved in chlorobenzene was spin-coated on the second charge transport layer 106 and annealed at 150° C. for 30 minutes.

Step 8: Deposition of Third Charge Transport Layer 209 on Second Active Layer 208

A $MoO_3$ layer was deposited on the second active layer 208 by performing thermal deposition. The thickness of the layer was 8 nm.

Step 9: Deposition of Second Electrode 107

A silver layer was deposited on the second charge transport layer 106 by performing thermal deposition. The thickness of the layer was 100 nm.

In the present invention, the most practical and preferred exemplary embodiments have been described, but the present invention should not be interpreted as being restricted to the Examples and the drawings. In the present invention, various modifications may be made within the spirit and scope described in the claims.

The invention claimed is:

1. A solar cell comprising:
   a transparent substrate;
   a porous layer provided on the transparent substrate, wherein the porous layer comprises a plurality of particles;
   a first photoactive layer provided on the plurality of particles;
   a first charge transport layer provided on the first photoactive layer;
   a first electrode provided on the porous layer, wherein the first electrode comprises at least one through-hole;
   a second charge transport layer provided on the first electrode and the first charge transport layer, wherein the second charge transport layer is in direct contact with the first charge transport layer, wherein each of the first charge transport layer and the second charge transport layer is a solid layer, and wherein both of the first charge transport layer and the second charge transport layer transport electrons or both of the first charge transport layer and the second charge transport layer transport holes; and a second electrode provided on the second charge transport layer.

2. The solar cell of claim 1, wherein a topographical morphology of a surface of the first electrode is the same as a topographical morphology of a surface of the porous layer.

3. The solar cell of claim 1, wherein a topographical morphology of a surface of the second charge transport layer is the same as a topographical morphology of a surface of the first electrode.

4. The solar cell of claim 1, wherein a topographical morphology of a surface of the second electrode is the same as a topographical morphology of a surface of the second charge transport layer.

5. The solar cell of claim 1, wherein the first photoactive layer comprises $CH_3NH_3PbI_3$, $CH_3NH_3PbCl_3$, $CH_3NH_3PbBr_3$, $CH_3NH_3PbI_{3-x}Cl$, $CH_3NH_3PbI_{3-x}Br_x$, $HC(NH_2)_2PbI_3$, $HC(NH_2)_2PbCl_3$, $HC(NH_2)_2PbBr_3$, $HC(NH_2)_2PbI_{3-x}Cl$, $HC(NH_2)_2PbI_{3-x}Br_x$, $[HC(NH_2)_2]_{1-x}Cs_xPbI_3$, $[HC(NH_2)_2]_{1-x}Cs_xPbBr_3$, $[HC(NH_2)_2]_{1-x}Cs_xPbI_{3-y}Br_y$, $CsPbI_{3-x}Br_x$, $CH_3NH_3Pb_{1-x}Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-\delta}Br_\delta$, $(CH_3NH_3)_{1-x-y-z}[HC(NH_2)_2]_zCs_yRb_xPbI_{3-d}Br_d$, azo type dyes, quinone type dyes, quinone-imine type dyes, quinacridone type dyes, squarylium type dyes, cyanine type dyes, merocyanine type dyes, triphenylmethane type dyes, xanthene type dyes, porphyrin type dyes, perylene type dyes, indigo type dyes, naphthalocyanine type dyes, or a combination thereof.

6. The solar cell of claim 1, wherein the solar cell further comprises a second photoactive layer provided on the second charge transport layer.

7. The solar cell of claim 6, wherein the second photoactive layer comprises a donor/acceptor bilayer structure including an electron donor layer and an electron acceptor layer, a bulk-heterojunction structure including a blend structure of the electron donor and the electron acceptor, or a combination structure where the bulk-heterojunction structure is inserted between the electron donor layer and the electron acceptor layer.

8. The solar cell of claim 6, wherein a topographical morphology of a surface of the second photoactive layer is the same as a topographical morphology of a surface of the second charge transport layer.

9. The solar cell of claim 6, wherein the solar cell further comprises a third charge transport layer provided on the second photoactive layer.

10. The solar cell of claim 9, wherein a topographical morphology of a surface of the third charge transport layer is the same as a topographical morphology of a surface of the second photoactive layer.

11. The solar cell of claim 9, wherein a topographical morphology of a surface of the second electrode is the same as a topographical morphology of a surface of the third charge transport layer.

12. A method for fabricating the solar cell of claim 1, the method comprising:

providing a transparent substrate;

depositing a porous layer on the transparent substrate, wherein the porous layer comprises a plurality of particles;

depositing a first electrode on the porous layer, wherein the first electrode comprises at least one through-hole;

depositing a first photoactive layer on the plurality of particles through the least one through-hole;

depositing a first charge transport layer on the first photoactive layer through the least one through-hole;

depositing a second charge transport layer on the first electrode and the first charge transport layer, wherein the second charge transport layer is in direct contact with the first charge transport layer, wherein each of the first charge transport layer and the second charge transport layer is a solid layer, and wherein both of the first charge transport layer and the second charge transport layer transport electrons or both of the first charge transport layer and the second charge transport layer transport holes; and depositing a second electrode on the second charge transport layer.

13. The method of claim 12, wherein a topographical morphology of a surface of the first electrode is the same as a topographical morphology of a surface of the porous layer.

14. The method of claim 12, wherein a topographical morphology of a surface of the second charge transport layer is the same as a topographical morphology of a surface of the first electrode.

15. The method of claim 12, wherein a topographical morphology of a surface of the second electrode is the same as a topographical morphology of a surface of the second charge transport layer.

16. The method of claim 12, wherein the method further comprises depositing a second photoactive layer on the second charge transport layer.

17. The method of claim 16, wherein a topographical morphology of a surface of the second photoactive layer is the same as a topographical morphology of a surface of the second charge transport layer.

18. The method of claim 16, wherein the method further comprises depositing a third charge transport layer on the second photoactive layer.

19. The method of claim 18, wherein a topographical morphology of a surface of the third charge transport layer is the same as a topographical morphology of a surface of the second photoactive layer.

20. The method of claim 18, wherein a topographical morphology of a surface of the second electrode is the same as a topographical morphology of a surface of the third charge transport layer.

\* \* \* \* \*